US008482697B2

(12) United States Patent
Li

(10) Patent No.: US 8,482,697 B2
(45) Date of Patent: Jul. 9, 2013

(54) PROTECTING MODULE AND PORTABLE ELECTRONIC DEVICE USING THE SAME

(75) Inventor: Hai-Bo Li, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 971 days.

(21) Appl. No.: 12/557,688

(22) Filed: Sep. 11, 2009

(65) Prior Publication Data

US 2010/0265431 A1 Oct. 21, 2010

(30) Foreign Application Priority Data

Apr. 21, 2009 (CN) .......................... 2009 1 0301724

(51) Int. Cl.
*G02F 1/1333* (2006.01)
(52) U.S. Cl.
USPC .................................. 349/59; 349/58; 349/60

(58) Field of Classification Search
USPC ...................................................... 349/58–60
See application file for complete search history.

(56) References Cited

U.S. PATENT DOCUMENTS 5,479,285 A * 12/1995 Burke ............................. 349/58
6,144,552 A * 11/2000 Whitcher et al. ........... 361/679.3

\* cited by examiner

*Primary Examiner* — Wen-Ying P Chen
(74) *Attorney, Agent, or Firm* — Altis Law Group, Inc.

(57) ABSTRACT

A protecting module for protecting a liquid crystal display module of a portable electronic device. The protecting module includes an electrical field shielding plate and a rubber gasket. The electrical field shielding plate defines a holding portion to receive the liquid crystal display module. The holding portion includes a bottom wall and a plurality of connected sidewalls extending from the bottom wall. The rubber gasket defines a slot to receive the bottom wall and the plurality of connected sidewalls. The liquid crystal display is received into the holding portion and resists against the rubber gasket.

16 Claims, 6 Drawing Sheets

PROTECTING MODULE AND PORTABLE ELECTRONIC DEVICE USING THE SAME

BACKGROUND

1. Technical Field

The present disclosure relates to portable electronic devices, and particularly, to a portable electronic device having a protecting module for a liquid crystal display module.

2. Description of the Related Art

Liquid crystal display modules are widely used in portable electronic devices such as personal digital assistants (PDA), mobile phones, etc. The portable electronic device usually includes a protecting module to protect the liquid crystal display modules.

A typical portable electronic device includes a liquid display module and a protecting module. The protecting module includes an electrical field shielding plate, a first foam gasket, and a second foam gasket. The electrical field shielding plate is made of metal, and defines a holding portion to receive the liquid display module. The electrical field shielding plate is configured to prevent electromagnetic radiation from interfering with the liquid display module. The first foam gasket is disposed in an outer surface of the electrical field shielding plate. The second foam gasket is disposed in the bottom of the holding portion. The first foam gasket and the second foam gasket are configured to prevent the liquid display modules from being damaged. However, the first foam gasket and the second foam gasket can slide relative to the electrical field shielding plate, such that there is a gap either between the first foam gasket and the electrical field shielding plate or between the second foam gasket and the electrical field shielding plate. Thus, dust could enter via the gap to pollute the liquid display modules.

Therefore, there is room for improvement within the art.

BRIEF DESCRIPTION OF THE DRAWINGS

Many aspects of the present portable electronic device can be better understood with reference to the following drawings. The components in the drawings are not necessarily drawn to scale, the emphasis instead being placed upon clearly illustrating the principles of the present portable electronic device. Moreover, in the drawings, like reference numerals designate corresponding parts throughout the several views.

DETAILED DESCRIPTION

Figure 1:
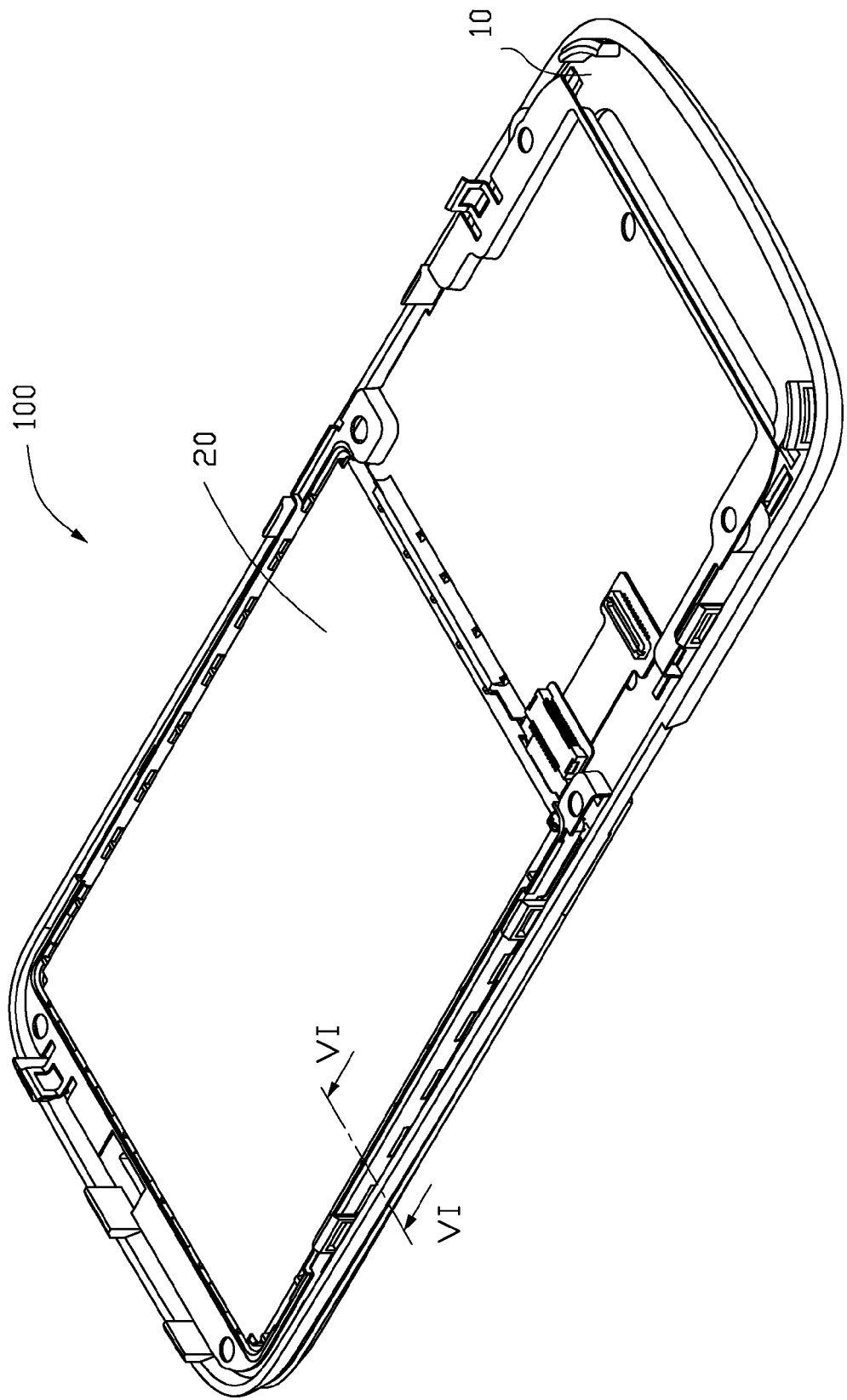
FIG. 1 is an isometric view of an exemplary embodiment of a protecting module including an foam gasket, an electrical field shielding plate, and a rubber gasket, shown in a portable electronic device.

Referring to FIG. 1, an exemplary embodiment of a portable electronic device 100, includes a front housing 10, a liquid crystal display module 20 and an exemplary embodiment of a protecting module 30. The protecting module 30 is disposed between the front housing 10 and the liquid display module 20. In the illustrated embodiment, the portable electronic device 100 is a mobile phone, but can be any portable electronic device 100 employing a liquid crystal module.

Figure 2:
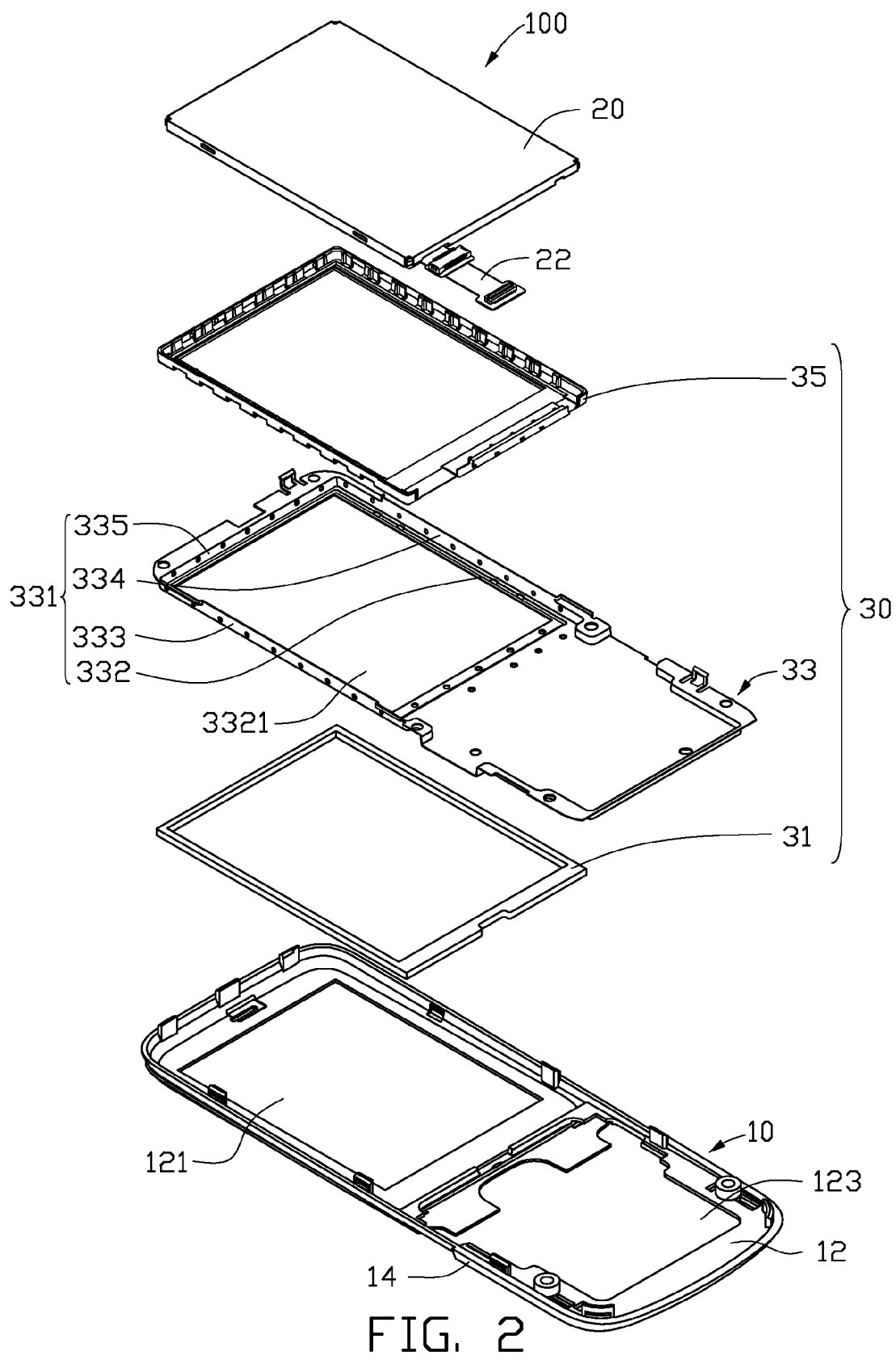
FIG. 2 is an exploded, isometric view of the portable electronic device shown in FIG. 1.
Figure 3:
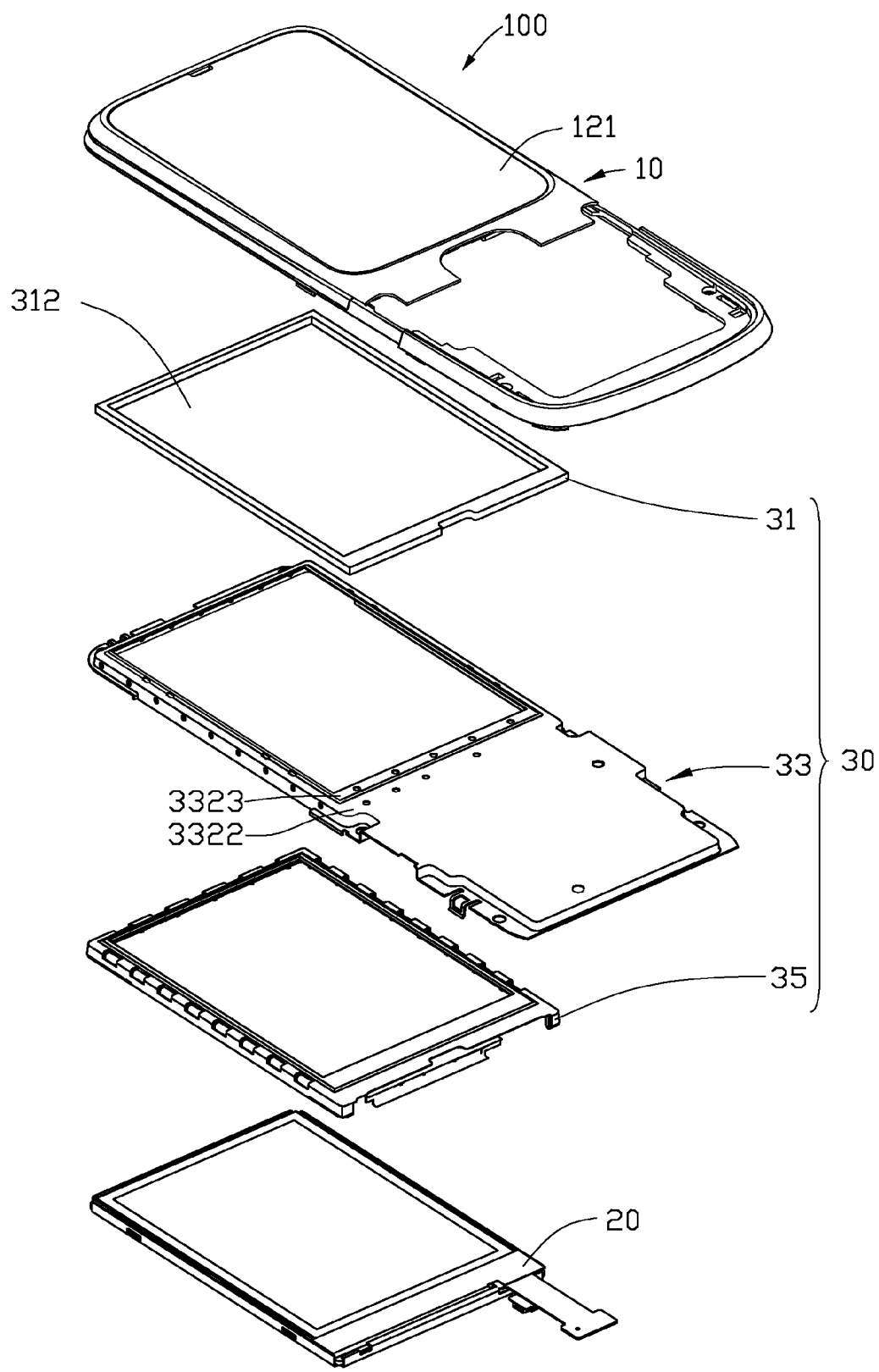
FIG. 3 is similar to FIG. 2, but viewed from another aspect.

Referring to FIGS. 2 and 3, the front housing 10 includes a main board 12 and a side frame 14 extending from an edge of the main board 12. The main board 12 includes a transparent screen 121 disposed therein. The main board 12 defines an opening 123 to assemble a keyboard (not shown).

The liquid crystal display module 20 is typically a rectangular sheet. The electronic device 100 further includes a flexible printed circuit 22 connected to an edge of the liquid crystal display 20. The flexible printed circuit 22 electrically interconnects the liquid crystal display 20 and other electronic elements (not shown).

The protecting module 30 includes a foam gasket 31, an electrical field shielding plate 33, and a rubber gasket 35. The foam gasket 31 is fixed to the rubber gasket 35. The electrical field shielding plate 33 is partially inserted into the rubber gasket 35.

The foam gasket 31 defines a first opening 312 to expose the liquid crystal display module 20. The size of the first opening 312 substantially corresponds to the size of the transparent screen 121 of the front housing 10.

The electrical field shielding plate 33 defines a holding portion 331 to receive the liquid crystal display module 20. The holding portion 331 includes a bottom wall 332, a first sidewall 333, a second sidewall 334 and a third sidewall 335. The third sidewall 335 connects the first sidewall 333 and the second sidewall 334 at two ends of the third sidewall 335. The first sidewall 333, the second sidewall 334 and the third sidewall 335 extend substantially perpendicularly from an edge of the bottom wall 332. The second sidewall 334 is arranged at the bottom wall 332 opposite to the first sidewall 333. The third sidewall 335 adjoins the first sidewall 333 and the second sidewall 334. The bottom wall 332 defines a second opening 3321 corresponding to the first opening 312 of the foam gasket 31. The electrical field shielding plate 33 further includes an annular stepped protrusion 3323. The protrusion 3323 is disposed on a surface 3322 of the bottom wall 332 surrounding the second opening 3321.

Figure 4:
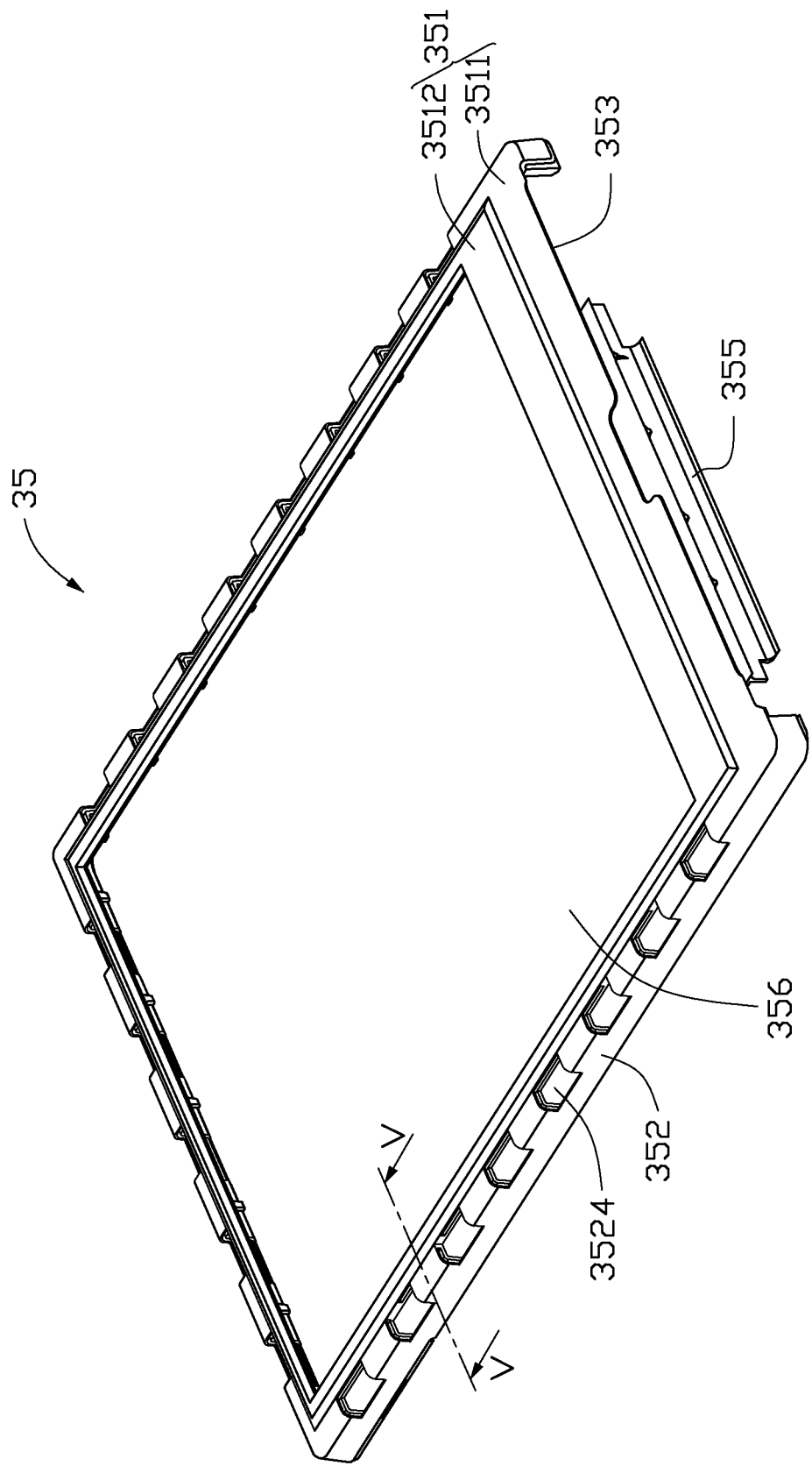
FIG. 4 is an enlarged, isometric view of a rubber gasket of the protecting module shown in FIG. 3.

Referring to FIG. 4, the rubber gasket 35 includes a bottom sheet 351, three side sheets 352 and a fixing protrusion 355. The bottom sheet 351 defines a third opening 356 in a middle portion of the bottom sheet 351. The third opening 356 corresponds to the second opening 3321 of the electrical field shielding plate 33. The bottom sheet 351 includes an annular positioning protrusion 3512 disposed on a surface 3511 of the bottom sheet 351. The annular positioning protrusion 3512 is configured to position the foam gasket 31. The three side sheets 352 extend substantially perpendicularly from three edges of the bottom sheet 351, and a gap 353 is defined between the opposite side sheets 352 on the other edge of the bottom sheet 351. The fixing protrusion 355 is disposed in the gap 353. Each of the side sheets 352 defines a plurality of through holes 3524. The through holes 3524 are evenly spaced apart from each other.

Figure 5:
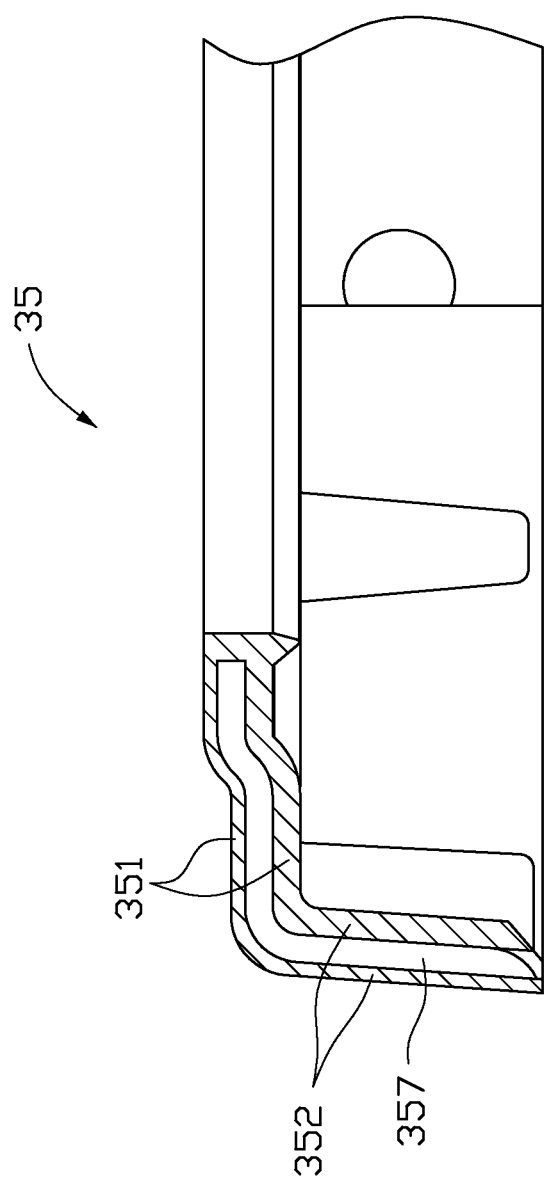
FIG. 5 is a partial, enlarged, cross-sectional view of the rubber gasket of FIG. 4, taken along line V-V.
Figure 6:
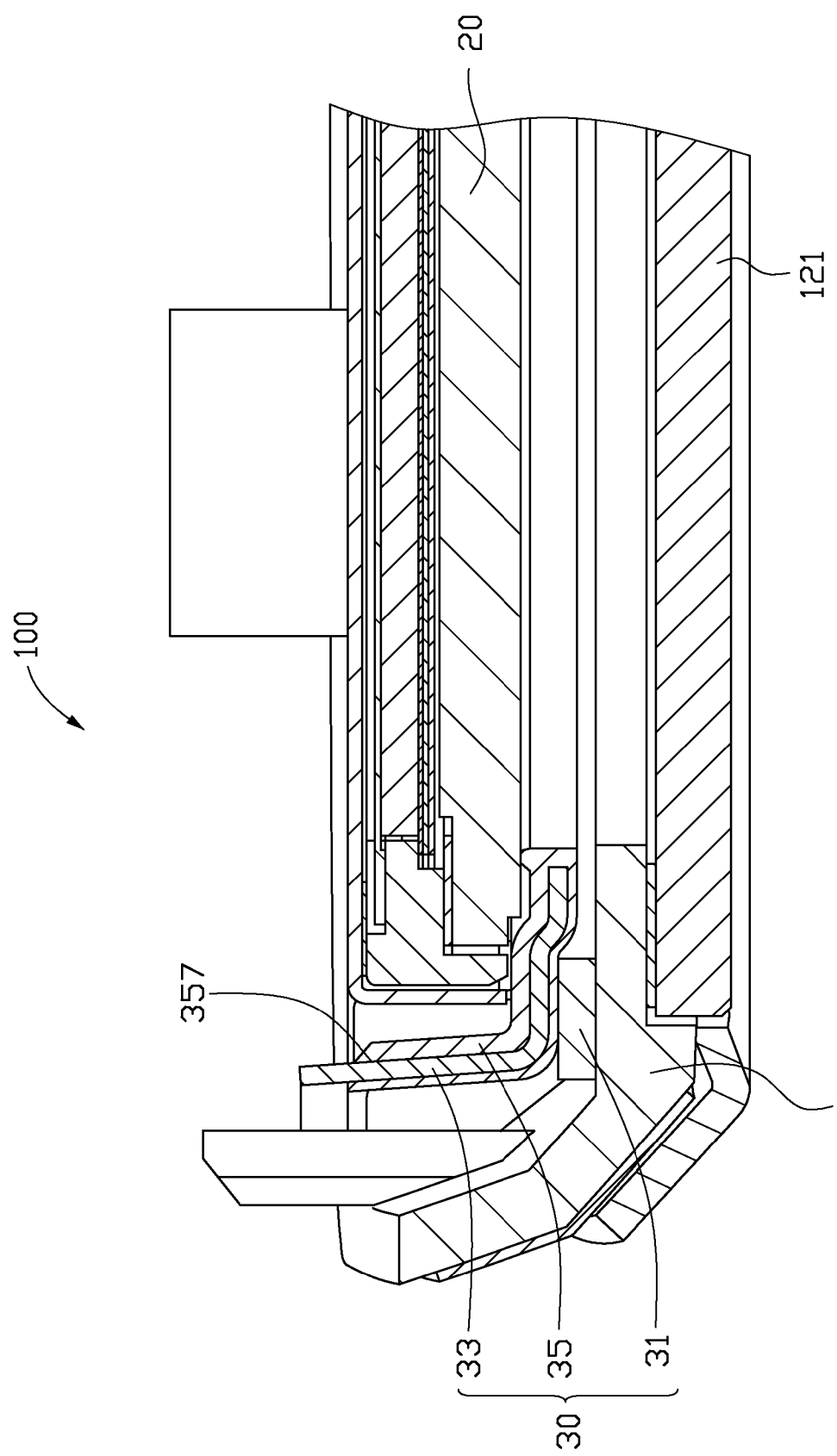
FIG. 6 is a partial, enlarged, cross-sectional view of the portable electronic device of FIG. 1, taken along line VI-VI.

Referring to FIGS. 5 and 6, the rubber gasket 35 further defines a slot 357. The bottom wall 332, the first sidewall 333, the second sidewall 334 and the third sidewall 335 of the shielding plate 33 can be correspondingly inserted into the slot 357. In the exemplary embodiment, the rubber gasket 35 is separately formed from the electrical field shielding plate 33. In an alternative embodiment, the rubber gasket 35 is integrally formed with the electrical field shielding plate 33 by insert molding.

To assemble the electronic device 100, the bottom wall 332, the first sidewall 333, and the second sidewall 334 and the third sidewall 335 of the electrical field shielding plate 33 are inserted into the slot 357 of the rubber gasket 35. The fixing protrusion 355 of the rubber gasket 35 resists the bottom wall 332 of the electrical field shielding plate 33. The foam gasket 31 is placed on an outer surface 3511 of the bottom plate 351 of the rubber gasket 35, and is positioned by the positioning protrusion 3512 of the rubber gasket 35. The electrical field shielding plate 33 with the foam gasket 31 and the rubber gasket 35 are placed on the front housing 10, such that the transparent screen 121 substantially corresponds to the first opening 312, the second opening 3321, and the third opening 356. The liquid crystal display module 20 is placed into the holding portion 331 of the electrical field shielding plate 33, and resists against the rubber gasket 35.

No gaps are formed either between the electrical field shielding plate 33 and the rubber gasket 35 or between the electrical field shielding plate 33 and the foam gasket 31. As a result, the liquid crystal display module 20 is protected from dust entering via the holding portion 331.

It should be pointed out that the foam gasket 31 can also be omitted, the rubber gasket 35 may resist against the front housing 10.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. A protecting module for protecting a liquid crystal display module of a portable electronic device, comprising:
    an electrical field shielding plate defining a holding portion to receive the liquid crystal display module, the holding portion comprising a bottom wall and a plurality of connected sidewalls extending from the bottom wall; and
    a rubber gasket defining a slot to receive the bottom wall and the plurality of connected sidewalls, the rubber gasket comprising a bottom plate and a plurality of side sheets extending substantially perpendicularly from edges of the bottom plate, a gap being defined between the opposite side sheets on the other edge of the bottom plate, the side sheets defining a plurality of through holes evenly spaced apart from each other;
    wherein the liquid crystal display module is received into the holding portion and resists against the rubber gasket.

2. The protecting module of claim 1, wherein the rubber gasket further comprises a fixing protrusion disposed in the gap.

3. The protecting module of claim 1, further comprising a foam gasket disposed on the bottom plate, the foam gasket defining a first opening; the electrical field shielding plate defines a second opening; the rubber gasket defines a third opening substantially corresponding to the first opening and the second opening.

4. The protecting module of claim 3, wherein the electrical field shielding plate further comprises an annular stepped protrusion disposed on an outer surface of the bottom wall surrounding the second opening.

5. The protecting module of claim 3, wherein the rubber gasket further comprises a positioning protrusion disposed on an outer surface of the bottom plate surrounding the third opening.

6. The protecting module of claim 1, wherein the rubber gasket is integrally formed with the electrical field shielding plate by insert molding.

7. A protecting module for protecting a liquid crystal display module, comprising:
    an electrical field shielding plate defining a holding portion to receive the liquid crystal display module, the holding portion comprising a bottom wall and a plurality of connected sidewalls extending from the bottom wall; and
    a rubber gasket integrally formed with the an electrical field shielding plate, and embracing the bottom wall and the plurality of connected sidewalls, the rubber gasket comprising a bottom plate and a plurality of side sheets extending substantially perpendicularly from edges of the bottom plate, a gap being defined between the opposite side sheets on the other edge of the bottom plate, and a fixing protrusion disposed in the gap;
    wherein the liquid crystal display is received into the holding portion and resists against the rubber gasket.

8. The protecting module of claim 7, wherein the side sheets define a plurality of through holes evenly spaced apart from each other.

9. The protecting module of claim 7, further comprising a foam gasket disposed on the bottom plate, the foam gasket defining a first opening; the electrical field shielding plate defines a second opening; the rubber gasket defines a third opening substantially corresponding to the first opening and the second opening.

10. The protecting module of claim 9, wherein the electrical field shielding plate further comprises an annular stepped protrusion disposed on an outer surface of the bottom wall surrounding the second opening.

11. The protecting module of claim 9, wherein the rubber gasket further comprises a positioning protrusion disposed on an outer surface of the bottom plate surrounding the third opening.

12. A portable electronic device, comprising:
    a front housing;
    a liquid crystal display module; and
    a protecting module disposed between the front housing and the liquid crystal display module, the protecting module comprising an electrical field shielding plate and a rubber gasket, the electrical field shielding plate defining a holding portion to receive the liquid crystal display module, the holding portion comprising a bottom wall and a plurality of connected sidewalls extending from the bottom wall, the rubber gasket defining a third opening and a slot, the slot receives the bottom wall and the plurality of connected sidewalls;
    wherein the liquid crystal display is received into the third opening of the rubber gasket and the holding portion and resists against the rubber gasket.

13. The portable electronic device of claim 12, wherein the rubber gasket comprises a bottom plate and a plurality side sheets extending perpendicularly from edges of the bottom plate, and a gap is defined between the opposite side sheets on the other edge of the bottom plate; the slot extends from a side surface of the side sheets to a middle portion of the bottom plate.

14. The portable electronic device of claim 13, wherein the rubber gasket further comprises a fixing protrusion disposed in the gap.

15. The portable electronic device of claim 13, wherein the side sheets define a plurality of through holes evenly spaced apart from each other.

16. The portable electronic device of claim 13, wherein the protecting module further comprises a foam gasket disposed on the bottom plate, the foam gasket defining a first opening; the electrical field shielding plate defines a second opening; the third opening substantially corresponding to the first opening and the second opening.

* * * * *